United States Patent
Anson et al.

(12) 
(10) Patent No.: US 6,392,915 B1
(45) Date of Patent: *May 21, 2002

(54) METHOD OF STORING AND RETRIEVING BINARY INFORMATION

(75) Inventors: Anthony W. Anson, Middlesex; Robert Bulpett, Buckinghamshire, both of (GB)

(73) Assignee: Dynamic Material Developments Limited, Shropshire (GB)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/346,782

(22) Filed: Jul. 7, 1999

(30) Foreign Application Priority Data

Aug. 3, 1998 (GB) ............................................. 9816799

(51) Int. Cl.[7] ............................................. G11C 13/00
(52) U.S. Cl. ........................................ 365/118; 365/106
(58) Field of Search ................ 365/106, 126, 365/127, 118, 113; 250/310

(56) References Cited

U.S. PATENT DOCUMENTS

| | | | |
|---|---|---|---|
| 3,530,441 A | * 9/1970 | Ovshinsky | 365/113 |
| 4,214,249 A | 7/1980 | Kasai et al. | 346/76 |
| 4,547,669 A | * 10/1985 | Nakagawa et al. | 250/310 |
| 4,774,702 A | * 9/1988 | Giacomel | 369/100 |
| 4,817,053 A | 3/1989 | Ikeda et al. | 365/113 |
| 4,888,758 A | 12/1989 | Scruggs et al. | 369/101 |
| 4,922,462 A | * 5/1990 | Ikegawa et al. | 365/113 |
| 5,194,349 A | * 3/1993 | Tsuo et al. | 365/113 |
| 5,348,811 A | 9/1994 | Nagao et al. | 428/699 |
| 5,406,509 A | * 4/1995 | Ovshinsky et al. | 365/113 |

FOREIGN PATENT DOCUMENTS

| | | |
|---|---|---|
| EP | 0335487 A2 | 10/1989 |
| EP | 0378443 A2 | 7/1990 |
| EP | 0411783 A2 | 2/1991 |
| EP | 0415762 A2 | 3/1991 |
| EP | 0734017 A1 | 9/1996 |
| GB | 1474199 | 5/1977 |
| WO | WO 97/44780 A1 | 11/1997 |

* cited by examiner

Primary Examiner—Trong Phan
(74) Attorney, Agent, or Firm—Craig A. Fieschko, Esq.; DeWitt Ross & Stevens S.C.

(57) ABSTRACT

A method of storing information on a material (preferably a shape memory alloy), including the step of heating a plurality of crystals of said material in order to effect a structural change in each said crystal, wherein the information stored on said material is encoded in the arrangement of changed and unchanged crystals. Preferably the structural change is a geometrical change in the crystals such as from rhomboidal to body-centered cubic. A method of reading information from such a material is provided, including the steps of scanning the surface of the material using an electron beam or a laser, analyzing the reflected electron beam or laser light, and decoding the information.

20 Claims, 3 Drawing Sheets

METHOD OF STORING AND RETRIEVING BINARY INFORMATION

FIELD OF THE INVENTION

This invention relates to a method of storing and retrieving information, and in particular a method of storing and retrieving binary signals by changing the geometry of individual crystals within a suitable material by thermal means.

BACKGROUND OF THE INVENTION

Memory systems currently employed by digital computers or other microprocessors rely on the use of magnetic and opto-magnetic media to write, store and read binary information. Technological development of electronic data processing has required an increase in the capacity and operational speed of data storage or memory systems. A modem personal computer may have a hard disc storage system that has a capacity of several giga-bytes; this can be increased by installing a higher density disk drive, by networking a series of computers or by sharing a high capacity server system. However, the operating speed, which determines the time taken to store or retrieve information, does not increase proportionally with the overall data storage capacity.

The present invention seeks to use the property of structural change in certain materials to store information which can be accessed by digital computers and the like.

Many materials have a structure whose essential crystalline geometry or volume may change due to thermal variations. The crystalline changes in steel alloys, as an example, is well documented in the published literature. A change from an austenic to martensitic crystalline form is one of the mechanisms whereby physical changes to the properties of the steel may be brought about. Hardness, elastic properties, toughness and other attributes may be generated by suitable heat-treatment in appropriate steel alloys. Other metal alloys exhibit these changes and are equally well known.

Certain metal alloys known as shape memory alloys are capable of changing their crystalline geometry and structure when heated, but, unlike the example of steel, shape memory alloys simply revert back to the original lower temperature crystalline format if allowed to cool to an appropriate temperature. Typically, the temperature range where this crystalline change may be arranged to occur is between −200° C. to 150° C. The actual temperature range depends upon the elemental constituents that the alloy is comprised of.

A shape memory alloy may be configured with a shape by constraining the material in a required geometry and heating to a memorising temperature for a short period. The temperature of the annealed material is then rapidly reduced, ideally to 0 to 5° C. A geometrical shape is now set within the structure of the material and can be recovered, consequent to mechanical deformation, by heating the material to a recovery transformation point, determined largely by the elemental composition.

Shape recovery is facilitated by a reversion of the crystalline structure of the material from martensite to austenite. In a martensite condition, the shape memory alloy has a rhomboidal form. Above the thermal transition point a conversion to the austenite phase occurs producing a body centred cubic lattice crystal form. The crystalline form will however show a phase change without mechanical deformation and this can be demonstrated by raising or lowering the temperature above or below the transformation point. The crystalline change results from the thermal energy input.

The temperature differential between martensite and austenite phases may be as much as 100 degrees Celsius with some alloys, for example Iron/Manganese/Silicon, or as little as 4 to 5 degrees Celsius with other alloys, for example Indium/Titanium. The range across all shape memory alloys from the lowest temperature martensite form to the highest temperature austenite form is approximately 400 degrees Celsius.

EP 0734017 (Hewlett-Packard Company) discloses a device for storing information (for example binary information) on a storage medium using field emitters. The field emitters, which emit beams of electrons from very sharp points, change the state of a storage area on the storage medium and thereby write information onto it. The storage medium is preferably a material whose structural state can be changed from crystalline to amorphous by electron beams, such as germanium telluride and ternary alloys based on germanium telluride.

EP 0378443 (Sharp Kabushiki Kaisha) discloses a method for recording and reproducing information on a recording medium by irradiating the medium with an electromagnetic wave such as visible radiation or by using an electron beam in order to vary the "work function" of the recording medium. The medium is preferably a material whose structure can reversibly change such as an alloy of telluride or indium.

EP 0335487 (International Business Machines Corporation) relates to a method for recording, reading and erasing data bits in a data storage device by using extended scanning tunnelling microscopy in order to selectively heat and then rapidly cool discreet areas of the film in order to change an electronic property of the area such as conductance, work function or band gap. Preferred data storage devices are substrates with a thin film of a compound material which undergoes reversible amorphous to crystalline phase transformations. Such materials include germanium telluride.

WO 97/44780 (International Business Machines Corporation) discloses a storage information method in which small indentations are made in a shape memory alloy layer by mechanical deformation using a local probe. The indents can be removed by locally heating the alloy layer to or above its transformation temperature. An example of a shape memory alloy is the binary titanium/nickel alloy.

U.S. Pat. No. 4,888,758 (Scruggs) discloses a storage information system in which a laser is used to melt discrete regions of a recording medium such as a tungsten-nickel-boron alloy. The regions then cool into an amorphous state and this can be detected using X-rays or an electron beam in order to read the information.

SUMMARY OF THE INVENTION

According to a first aspect of the present invention, there is provided a method of storing information on a material, comprising the step of selectively heating individual crystals of said material in order to effect a structural change in each said crystal, wherein the information stored on said material is encoded in the arrangement of changed and unchanged crystals. Preferably, the crystals of said material are notionally grouped in sets of eight crystals, such that each set comprises a byte of eight bits of encoded information.

It has been discovered that the smallest unit within a metal alloy that will exhibit a geometrical change is a single crystal comprised of the constitutive crystalline elements. For example, in the case of a body centred cubic lattice of nickel/titanium, the individual crystal elements are the nickel and titanium atoms, which are disposed on the corners and faces of a notional cube. Thus each crystal consists of fourteen atoms (seven titanium atoms and seven nickel atoms ion the case of an equi-atomic alloy). If the heating means can be directed to an individual crystal in order to heat it to, or above, its transition point, then the crystalline form of the crystal will change.

In the example of nickel/titanium alloy, the geometrical structure of the crystal changes from rhomboidal to body-centred cubic. Each crystal can be thought of as a 'bit' of information, with a crystal in a rhomboidal form representing a '0', and a crystal in a body-centred cubic form representing a '1', in binary code. In this manner, binary information can be encoded by changing the crystal geometry, and the storage density on a given surface area of material can be maximised.

For example, the letter 'A' might be encoded in binary format as 10000001, the letter 'B' as 10000010, the letter 'C' as 10000011, and so on up to the letter 'Z' as 10011010. It will be appreciated that other encoding schemes may be employed. Complete alpha-numeric or other coded and translatable information may be generated by addressing groups of eight crystals.

A microscopic examination of the material's surface using a transmission electron microscope (TEM) or Atomic Force Microscopy is employed to identify the position of a single crystal (that is by using the spatial relationship of the crystal to the electron beam). This can be done by calculating the position of the electron beam from the potential difference applied to the 'X' and 'Y' electromagnetic deflection plates in the TEM. Once the crystal position has been determined, the heat source can be activated and aimed at the crystal site. The crystal is examined after heating to see whether it has been subjected to a phase change. If it has not, the process is repeated until a phase change is achieved.

The heating means may be an electron beam, laser or other source whose cross-section is smaller than the cross sectional area of a crystal when viewed in plan. Preferably, an electron beam, such as that used as the visualisation method in a scanning or transmission electron microscopy system, is used to heat each of the crystals.

The electron beam is generated by methods known in the art, for example by employing an incandescent filament, and is directed to an appropriate position on the surface of the material by means of a series of electromagnets which can steer the beam with suitable resolution. The electron beam may be played across the surface of the alloy, being turned on or off as required to change individual crystals. Generating and steering the electron beam is known in the art, being used commonly in cathode ray tubes and electron microscopy.

The electron beam is preferably 2 to 20 nm in cross section, and most preferably 10 nm. Thermal energy imparted to the crystals from an electron beam due to energetic electron contact with the crystal surface is preferably of the order of 150 kV at $10^{-12}$ A which might be a typical energy density of a scanning electron microscopy system. This energy can be increased substantially but it is also desirable to minimise the thermal mass of the crystals thereby reducing the time taken to transfer sufficient heat to them. Equally, the residency time, which is the time for which the electron beam is in contact with each crystal, can be reduced if thermal mass is small. This is achieved by producing a thin film or monolayer of crystals deposited onto a dimensionally stable substrate such as a silicon, ceramic or transition glass material, by plasma, metal spraying or vacuum deposition techniques.

If the form of discrete crystals is to be changed, then it is important that the thermal energy imparted to each crystal does not 'leach' and heat up neighbouring crystals. This is achieved by the careful balancing of the energy of the electron beam and the residency time. If the energy of the beam is relatively high, then the residency time has to be kept short, in order that neighbouring crystals do not heat up and change their structure. If the energy of the beam is relatively low, then the residency time can be longer, although this will mean that the total time taken to encode information is longer and the process is therefore less efficient.

The energy imparted to an electron bean is a function of the potential difference used to generate the beam and the current generated by the beam.

Preferably, the electron beam has an energy range resulting from a potential difference of from 50 kV and a current of from $10^{-16}$ A to a potential difference of 250 kV and a current of $10^{-6}$ A and a residency time range of from 20 seconds when said energy is at the lower end of the energy range to 0.25 nanoseconds when said energy is at the upper end of the energy range.

More preferably, the electron beam has an energy range resulting from a potential difference of from 110 kV and a current of from $10^{-12}$ A to a potential difference of 200 kV and a current of $10^{-10}$ A and a residency time range of from 50 milliseconds when said energy is at the lower end of the energy range to 5 nanoseconds when said energy is at the upper end of the energy range.

Most preferably, the electron beam has an energy resulting from a potential difference of about 150 kV and a current of about $10^{-12}$ A and the beam impinges on each crystal for a residency time of about 5 microseconds.

A suitable material is one that undergoes a phase change on heating. Preferably, the material is an alloy, and most preferably a shape memory alloy. In the case of a shape memory alloy, the phase change is a geometrical change in the crystalline structure of the alloy, for example from rhomboidal to body-centred cubic. Preferred shape memory alloys include iron/manganese/silicon, indium/titanium, nickel/titanium/hafnium, nickei/titanium/zirconium, copper/aluminium/nickel, copper/zinc/iron and nickel/titanium.

According to a second aspect of the invention, there is provided a method of reading information from a material on which information has been stored by a method as described above, comprising the step of analysing the surface of the material and decoding the information.

Preferably, the surface of the material is scanned using an electron beam or a laser and the reflected electron beam or laser light is analyzed to decode the information. In the case of a shape memory alloy, it is preferably the geometrical structure of the surface of the alloy that is 'read'.

Recovering or reading the binary information requires an electron beam (or laser) to scan the plurality of crystals but with a substantially reduced energy quantum, so as not to bring about any change in the crystals. The typical energies of electron microscopy systems are therefore reduced so as to limit potential thermal energy transfer at the surface of the material. The reduced thermal activity does not have sufficient energy to cause a crystal change but still allows secondary electron deflection, which is detected by a suitable transducer in order to enable the characterisation of the topography of the material.

In order to 'read' the material surface, an electron beam preferably has an energy range resulting from a potential difference of from 50 kV and a current of from $10^{-20}$ A to a potential difference of 100 kV and a current of $10^{-14}$ A and the beam impinges on each crystal for a residency time of from 25 nanoseconds when said energy is at the lower end of the energy range to 50 nanoseconds when said energy is at the upper end of the energy range.

Most preferably, the electron beam has an energy resulting from a potential difference of about 50 kV and a current of about $10^{-17}$ A and the residency time is about 35 nanoseconds.

A binary information system based on the crystalline change described can have a capacity as follows:

Assume a monolayer of crystals occupying a surface area of 10 cm×10 cm.

A crystal of nickel/titanium alloy has a volume occupying a cubic area of approximately 10 nm×10 nm×10 nm.

In a single axid 'X' there are 10 cm×10 nm=$10^{-2} \times 10^{-8}$=$10^{10}$ bits.

In a single axis 'Y' there are 10 cm×10 nm=$10^{-2} \times 10^{-8}$=$10^{10}$ bits.

Therefore $10^{10} \times 10^{10} = 10^{20}$ crystals are available.

A smaller or larger thin film/monolayer surface area can be utilized; in each case however it would not be possible to have a usable binary information system which allowed all crystals to be available an in a '1' or '0' state. Although the number of available crystals is large, the spatial stability of all elements in the system described could not be guaranteed due to a number of physical changes that are likely to occur such as vibration and thermal-environment changes. Furthermore, a number of parity and marker points will be required in the crystalline matrix so that the electron beam has a null or reference point from which to re-establish an x-y coordinate position. The method described that enables binary information to be read is the a system that can be used to up-date electron beam position. However, a number of crystals will be required to act as positional markers. The number of markers required will depend on the number of overall crystals but at least 2% of the entire crystal array may be needed.

Another embodiment may be segmented and physically separated blocks of crystals. The means of establishing a thin film or monolayer of crystal previously described can be used to deposit the segmented matrix; the separation or partition then becomes a marker, and a reference point taken.

Another embodiment may be a single reference point established and fixed within the matrix. The electron beam is directed to this reference after writing or reading a pre-determined number of crystals.

BRIEF DESCRIPTION OF THE DRAWINGS

The present invention is described with respect to particular exemplary embodiments thereof and reference is accordingly made to the drawings, in which.

DETAILED DESCRIPTION

Figure 1:
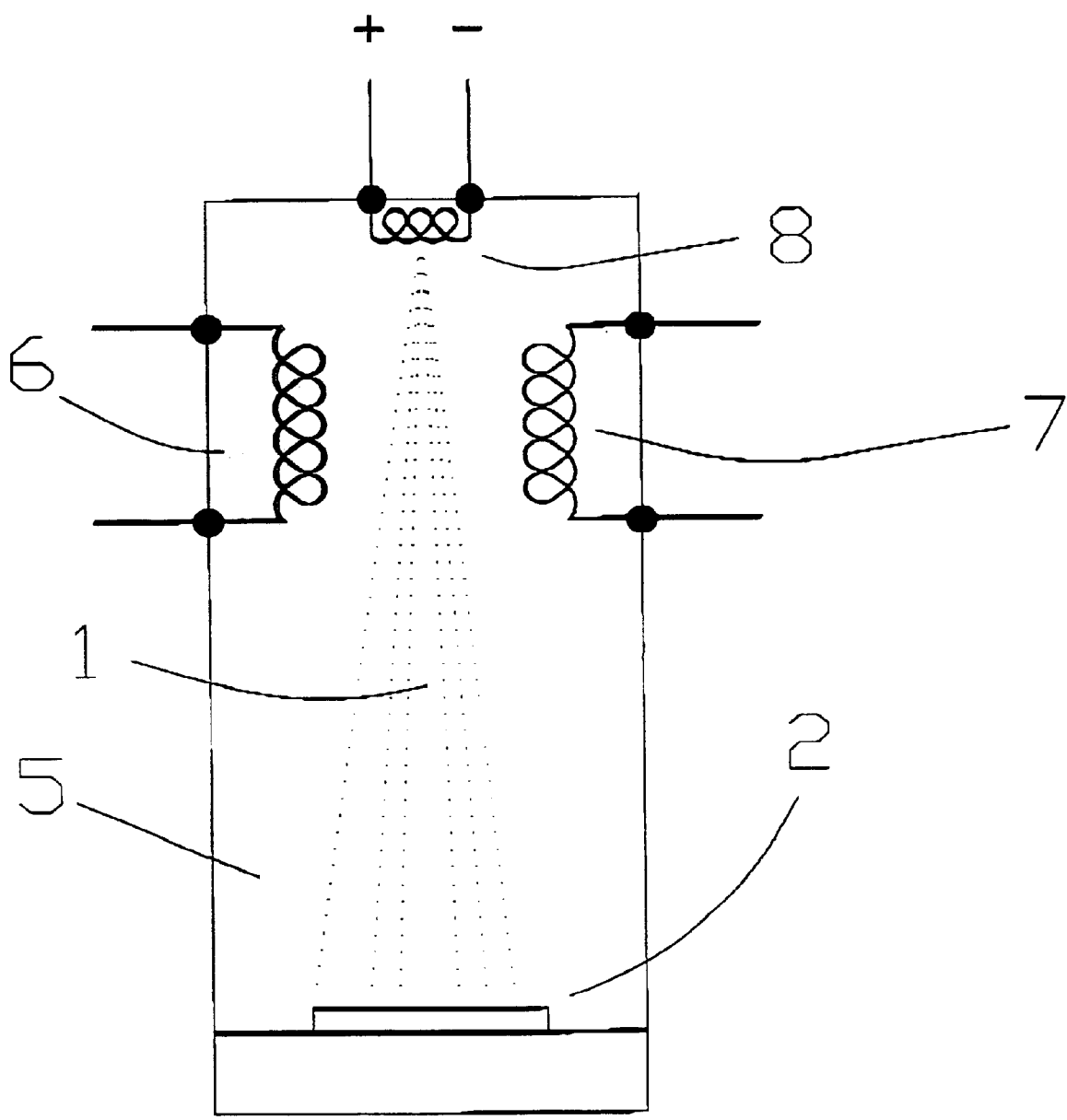
FIG. 1 illustrates an electron beam source for carrying out a method of writing information onto an alloy in accordance with the invention.

In FIG. 1, electrically heated filament (8) generates electron beam (1), which is directed in the x-y plane by electromagnets (6,7) through evacuated chamber (5) to impinge upon the surface of shape memory alloy (2). Binary information is written by thermal means, into the crystal structure by turning the electron stream on or off as it traverses across the surface of the crystal structure.

Figure 2:
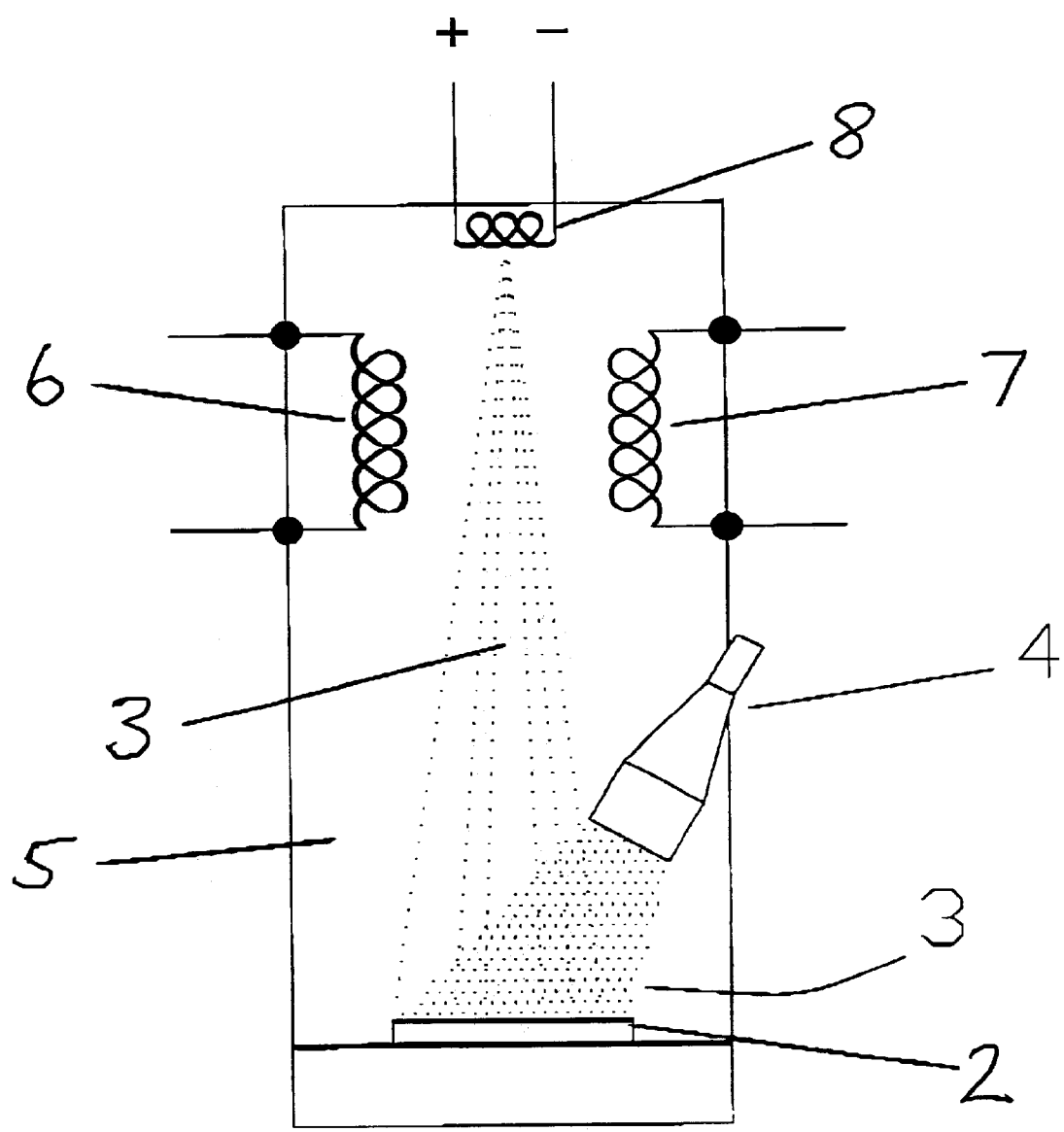
FIG. 2 illustrates an electron beam source for reading information from an alloy in accordance with the invention.

An apparatus for reading the binary information is shown in FIG. 2. Deflection of the electron beam (3) from the crystal structure is detected by a transducer (4). The electrical output from said detector goes to an image analysis system (not shown). Crystals that have been converted from martensite to austenite are counted and their position in the x-y matrix calculated using the image analysis system.

Figure 3:
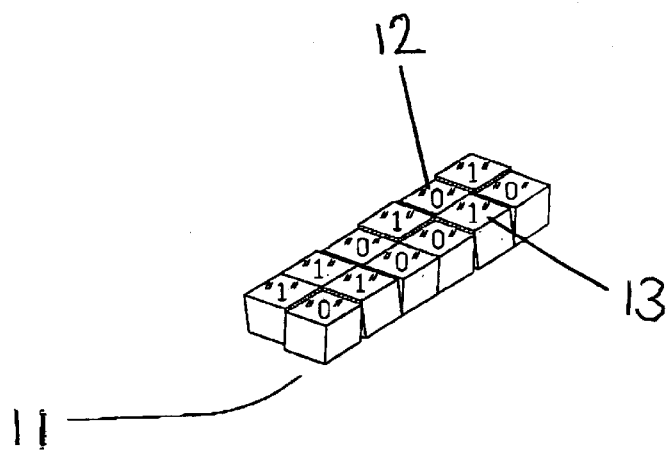
FIG. 3 illustrates schematically the surface of an alloy having information encoded thereon in accordance with the invention.
Figure 3:
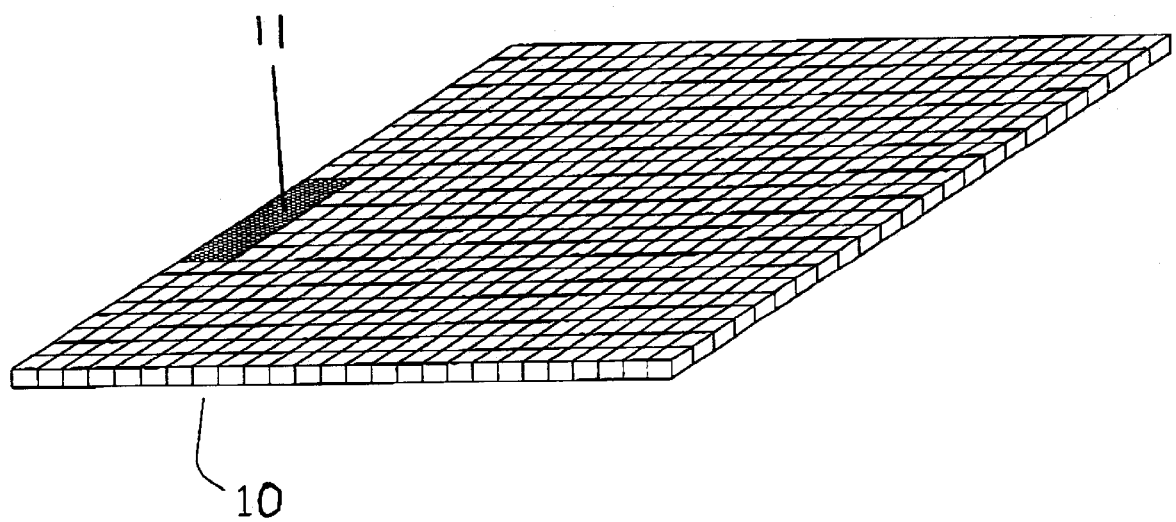

FIG. 3 shows a schematic illustration of the surface of shape memory alloy (2) after it has had information written onto it by the apparatus of FIG. 1. A group of crystals (11) in alloy surface (10) are shown in rhomboidal form (12), which is notionally binary digit '0', and in body centred cubic form (13), which is notionally binary digit '1'.

A functional demonstration of a thermally induced, reversible phase change in a shape memory alloy may be realised as follows:

A commercially available Transmission Electron Microscope (TEM) consisting of an electron beam generator, electron beam accelerator, electron beam steering means and evacuated sample chamber, has a shape memory alloythin film deposited onto a silicon substrate suitably positioned within said evacuated chamber.

The machine is turned on and set at a magnification range between times 700,000 to times 800,000. The surface of the shape memory alloy is visualized so as to identify individual crystals of the alloy. The visualization process requires an electron beam energy that will not impart sufficient thermal energy into the shape memory alloy to cause a phase change to the metal structure, but of sufficient energy to generate an image of the alloy structure on a visual display screen. A suitable energy is in the range 50 kV and $10^{-12}$ to $10^{-18}$ Amperes.

When a single crystal has been visualised, the electron beam energy is turned up to impart substantially more thermal energy to the shape memory alloy. This may be achieved by increasing the electron density at source (from the filament), electrical energy to the electron beam accelerator system and adjustment to minimize beam divergence by means of the focusing system. The focus system is capable of controlling the "spot" diameter of the beam from a minimum value of approximately 2 nanometers. A beam dimension of 2 to 10 nanometers would be an optimum size range.

The electron beam is now used to impart heat to the previously visualised individual crystal. In order to bring about the phase change, the beam residency time may be in the order of a few milliseconds; this is essentially dependent upon the thermal energy quantum transferred to the crystal. However, to prevent gross phase changes occurring, due to heat conduction or radiation effects crystal-to-crystal, an increase in beam energy is required so that residency time can be decreased, thereby reducing conduction or radiation. Preventing unwanted thermal transfer and subsequent phase changes will also require the selection of a shape memory alloy, the complete phase change cycle (martensite to austenite to martensite) of which has sufficient thermal hysteresis in the cold-to-warm-to-cold cycle so that small unpreventable amounts of thermal exchange will be of insufficient magnitude to cause unwanted phase changes. Increasing electron beam energy and selecting a suitable shape memory alloy will facilitate the rapid phase-change of large numbers of crystals in very short periods of time.

To "read" the crystals that have been subjected to a thermally induced phase-change, the TEM machine can be reconfigured to its original settings to visualise the alloy structure. A visual memory map can be stored in a microprocessor using simple image analysis algorithms and can then be interrogated and a comparison made between original and final configurations.

The use of the electron beam in the manner described can produce a change in one or more crystals as required. However, if the electron beam is allowed to traverse the surface of the shape memory alloy in the 'X' and 'Y' axes and at the same time the beam is turned on or off, a binary signal can be derived from one or other of the phase-change geometries. The crystals can be considered as a bistable element. A high resolution 'X' 'Y' movement stage may be incorporated into the TEM to enable movement of the shape memory alloy so as to increase the "bandwidth" of the memory device (high magnification of the TEM will limit the 'X' 'Y' surface scanning range).

What is claimed is:

1. A method of storing information on a material, comprising:
    selectively heating individual crystals of said material in order to effect a structural change in each said crystal, by:
        determining the position of a single crystal of the material to be heated;
        directing an electron beam at the single crystal to heat the single crystal;
        permitting the electron beam to reside directed at the single crystal until the single crystal undergoes a structural change;
        ceasing to direct the electron beam at the single crystal before one or more of the crystals adjacent the single crystal undergoes a structural change;
    wherein the information stored on said material is encoded in the arrangement of changed and unchanged crystals, wherein an electron beam, which is from 2–20 nm in cross section, is used to heat the crystals.

2. A method as claimed in claim 1, wherein the crystals of said material are notionally grouped in sets of eight crystals, such that each set comprises a byte of eight bits of encoded information.

3. A method as claimed in claim 1, wherein a scanning or transmission electron microscope is used to generate the electron beam.

4. A method as claimed in claim 1, wherein the electron beam is scanned over the surface of the material and turned on and off in sequence in order to heat individual crystals.

5. A method as claimed in claim 4, wherein the electron beam has an energy range resulting from a potential difference of from 50 kV and a current of from $10^{-16}$ A to a potential difference of 250 kV and a current of $10^{-6}$ A and wherein said beam impinges on each crystal for a residency time of from 20 seconds when said energy is at the lower end of the energy range to residency time of 0.25 nanoseconds when said energy is at the upper end of the energy range.

6. A method as claimed in claim 5, wherein the electron beam has an energy range resulting from a potential difference of from 100 kV and a current of from $10^{-12}$ A to a potential difference of 200 kV and a current of $10^{-10}$ A and wherein said beam impinges on each crystal for a residency time of from 50 milliseconds when said energy is at the lower end of the energy range to residency time of 5 nanoseconds when said energy is at the upper end of the energy range.

7. A method as claimed in claim 6, wherein the electron beam has an energy resulting from a potential difference of about 150 kV and a current of about $10^{-12}$ A and wherein said beam impinges on each crystal for a residency time of about 5 microseconds.

8. A method as claimed in claim 1, wherein the electron beam is about 10 nm in cross section.

9. A method as claimed in claim 1, wherein said material is a metal alloy.

10. A method as claimed in claim 9, wherein said metal alloy is a shape memory alloy.

11. A method as claimed in claim 10, wherein said structural change is a geometrical change in said crystalline structure of said metal alloy.

12. A method as claimed in claim 11, wherein said geometrical change is from rhomboidal to body-centred cubic.

13. A method as claimed in claim 12, wherein said metal alloy is selected from a group consisting of iron/manganese/silicon, indium/titanium, nickel/titanium/hafnium, nickel/titanium/zirconium, copper/aluminum/nickel, copper/zinc/iron, and nickel/titanium.

14. A method as claimed in claim 13, wherein said metal alloy is nickel/titanium/hafnium or nickel/titanium/zirconium.

15. A method of reading information from said material on which information has been stored by a method as claimed in claim 1, comprising the steps of scanning a surface of said material using an electron beam or a laser, analyzing a reflected electron beam or laser light, and decoding the information.

16. A method as claimed in claim 15, wherein an electron beam is used to scan said surface, said beam having an energy range resulting from a potential difference of from 50 kV and a current of from $10^{-20}$ A to a potential difference of 100 kV and a current of $10^{-14}$ A and wherein said beam impinges on each crystal for a residency time of from 25 nanoseconds when said energy is at a lower end of said energy range to 50 nanoseconds when said energy is at upper end of said energy range.

17. A method as claimed in claim 16, wherein said electron beam has in energy resulting from a potential difference of about 50 kV and a current of about 1047 A and wherein said residency time is about 35 nanoseconds.

18. An alloy having information stored thereon by means of a method as claimed in any one of claims 1 to 14.

19. A method as claimed in claim 1, wherein said material is a monolayer of crystals deposited on a substrate.

20. A method of storing information, comprising:
    preparing a material comprising crystals having a first structure;
    associating a sequence of bits of said information, with a sequence of said crystals that are adjacent in said material; and
    for each crystal in said sequence, leaving said crystal with said first structure if an associated bit has a first value, and heating an area of said material corresponding to said crystal if said associated bit has a second value, said heating changing said crystal to a second structure;
    wherein said heating comprises irradiating said area with an electron beam from 2 to 20 nm in cross section;
    wherein said heating further comprises:
        determining the position of said crystal to be heated;
        directing an electron beam at said crystal to heat said crystal;
        permitting the electron beam to reside directed at said crystal until said crystal undergoes a structural change; and
    ceasing to direct the electron beam at said crystal before one or more of the crystals adjacent said crystal undergoes a structural change.

* * * * *